(12) United States Patent
Wada

(10) Patent No.: US 12,387,961 B2
(45) Date of Patent: Aug. 12, 2025

(54) ARTICLE TRANSPORT VEHICLE

(71) Applicant: Daifuku Co., Ltd., Osaka (JP)

(72) Inventor: Yoshinari Wada, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 255 days.

(21) Appl. No.: 18/219,160

(22) Filed: Jul. 7, 2023

(65) Prior Publication Data

US 2024/0014058 A1 Jan. 11, 2024

(30) Foreign Application Priority Data

Jul. 8, 2022 (JP) .................... 2022-110744

(51) Int. Cl.
*H01L 21/677* (2006.01)
*B66C 11/04* (2006.01)
*B66C 19/00* (2006.01)

(52) U.S. Cl.
CPC ........ *H01L 21/67712* (2013.01); *B66C 11/04* (2013.01); *B66C 19/00* (2013.01); *H01L 21/67706* (2013.01); *H01L 21/67724* (2013.01); *H01L 21/67733* (2013.01)

(58) Field of Classification Search
CPC ......... B66C 11/00; B66C 11/04; B66C 11/06; B66C 11/12; B66C 13/04; B66C 13/06; B66C 15/00; B66C 15/02; B66C 19/00; B65G 1/0457; B65G 35/00; B65G 2201/0297; H01L 21/677; H01L 21/67724; H01L 21/67733; H01L 21/6773
USPC ........................................................ 212/328
See application file for complete search history.

(56) References Cited

U.S. PATENT DOCUMENTS

| | | | | |
|---|---|---|---|---|
| 5,478,181 A | * | 12/1995 | Rudolf, III | B66C 13/06 |
| | | | | 212/319 |
| 8,726,811 B2 | * | 5/2014 | Kobayashi | H01L 21/67733 |
| | | | | 414/282 |
| 8,939,696 B2 | * | 1/2015 | Lee | H01L 21/67733 |
| | | | | 414/222.01 |
| 9,312,158 B2 | * | 4/2016 | Wada | B66C 19/00 |

(Continued)

FOREIGN PATENT DOCUMENTS

| | | | | |
|---|---|---|---|---|
| CN | 108910684 A | * | 11/2018 | B66C 1/28 |
| CN | 113003439 A | * | 6/2021 | |

(Continued)

*Primary Examiner* — Anna M Momper
*Assistant Examiner* — Henrix Soto
(74) *Attorney, Agent, or Firm* — The Webb Law Firm

(57) ABSTRACT

An article transport vehicle of this disclosure includes a fall restricting device. A vehicle body of the article transport vehicle includes a first cover section, a second cover section, and a cover connecting section. The fall restricting device includes a pair of fall restricting members and a driving mechanism. The pair of fall restricting members each include a supported section, a pair of vertical extension sections, and a lower connecting section. The driving mechanism drives the pair of fall restricting members to move between a restricting position and a release position. At the restricting position, the pair of vertical extension sections overlap a stored article in a second direction view, and furthermore the lower connecting section overlaps the stored article in a vertical view. At the release position, the lower connecting section does not overlap the stored article in the vertical view.

6 Claims, 11 Drawing Sheets

(56) References Cited

U.S. PATENT DOCUMENTS

2013/0220959 A1\* 8/2013 Won .................... H01L 21/6773
                                                        254/266
2015/0197412 A1    7/2015 Tomida
2021/0398835 A1\* 12/2021 Torazawa .......... H01L 21/67736

FOREIGN PATENT DOCUMENTS

| JP | 07252086 A | \* | 10/1995 |
| JP | H0977455 A | \* | 3/1997 |
| JP | 2001151466 A | \* | 6/2001 |
| JP | 2006096475 A | \* | 4/2006 |
| JP | 2015131702 A | | 7/2015 |
| KR | 20210025353 A | \* | 3/2021 |

\* cited by examiner

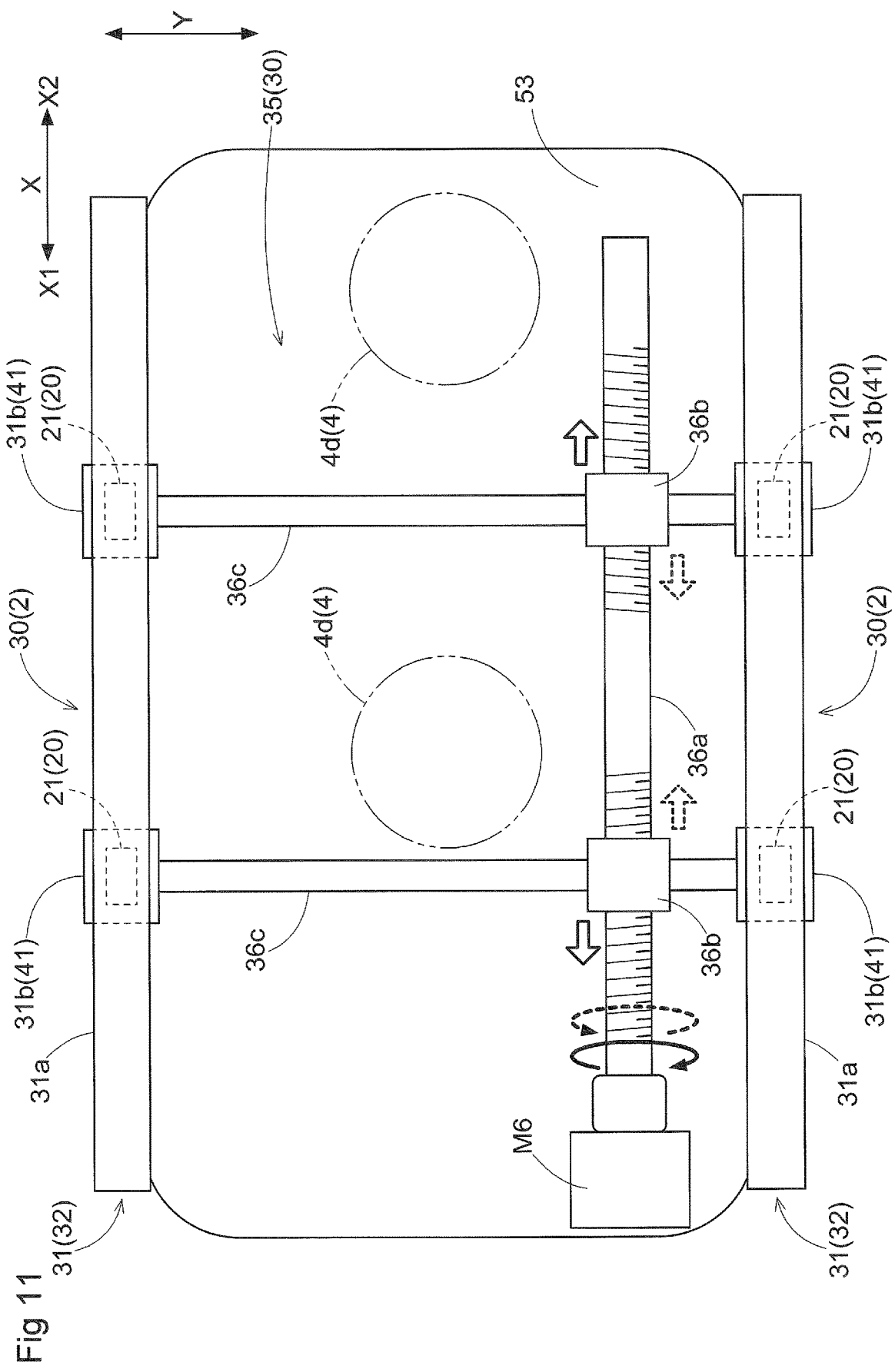

ARTICLE TRANSPORT VEHICLE

CROSS-REFERENCE TO RELATED APPLICATION

This application claims priority to Japanese Patent Application No. 2022-110744 filed Jul. 8, 2022, the disclosure of which is hereby incorporated by reference in its entirety.

BACKGROUND OF THE INVENTION

1. Field of the Invention

The present invention relates to an article transport vehicle for transporting an article.

2. Description of the Related Art

As one example, JP 2015-131702A (Patent Document 1) discloses an article transport vehicle that includes a pair of fall restriction members. The reference numerals shown in parentheses in the following description of the related art are those used in Patent Document 1.

The article transport vehicle (overhead transport vehicle 1) of Patent Document 1 includes a traveling section (travel moving section 12) that travels on a traveling rail (2), a holding section (support mechanism 19) that suspends and holds an article (transport article 6), an elevating section (elevating operation mechanism 20) that supports and can raise and lower the holding section, a cover section (21) that covers the top and sides of an article positioned at a transport position, and a pair of fall restricting members (a pair of fall prevention bodies 27) provided at positions spaced apart from each other in the traveling direction of the traveling section. The pair of fall restricting members are arranged below the article at the transport position, and are configured to move toward and away from each other along the horizontal plane. While the article transport vehicle is traveling, the pair of fall restricting members are arranged at positions overlapping the article at the transport position when viewed in the up-down direction. Therefore, even if the article held by the holding section is released unintentionally, the article can be supported by the pair of fall restricting members, and it is possible to avoid a situation in which the article falls below the pair of fall restricting members.

In the article transport vehicle of Patent Document 1, the pair of fall restricting members are provided in a cantilevered state on a support section (support portion 21a) of the cover section (21). For this reason, if the article held by the holding section is released unintentionally, a bending moment acts on the pair of fall restricting members and the support section of the cover section (21) that supports the fall restricting members. Therefore, if a heavy article is to be transported, it is necessary to secure sufficient strength for the fall restricting members and the support section in order to be able to support the bending moment generated by supporting the article. Accordingly, there is a problem that the size of the fall restricting members and the support section increases, thus leading to an increase in the size of the article transport vehicle and a rise in cost.

SUMMARY OF THE INVENTION

In view of the above, there is desire to realize an article transport vehicle provided with a fall restricting device having a structure that enables easily ensuring strength regardless of the weight of the article.

An article transport vehicle according to an aspect of the present disclosure is an article transport vehicle configured to transport an article, the article transport vehicle including:
a traveling section including a wheel;
a vehicle body connected to the traveling section and forming a storage space in which the article is storable;
a holding section configured to hold the article in a suspended state;
an elevating section configured to raise and lower the holding section relative to the vehicle body to raise and lower the article held by the holding section between a storage position inside the storage space and a lowered position below the storage space; and
a fall restricting device configured to restrict falling of a stored article, the stored article being the article at the storage position,
wherein with a first direction being a specific direction in a horizontal plane, a second direction being a direction orthogonal to the first direction in a vertical view, a first side in the first direction being one side in the first direction, and a second side in the first direction being another side in the first direction,
the vehicle body includes:
a first cover section covering the storage space on the first side in the first direction;
a second cover section covering the storage space on the second side in the first direction; and
a cover connecting section connecting the first cover section and the second cover section above the storage space,
the fall restricting device includes:
a pair of fall restricting members; and
a driving mechanism configured to drive the pair of fall restricting members,
the pair of fall restricting members each include:
a supported section supported by the cover connecting section;
a pair of vertical extension sections extending downward from the supported section on opposite sides of the stored article in the second direction; and
a lower connecting section connecting the pair of vertical extension sections below the stored article,
the driving mechanism is configured to drive the pair of fall restricting members to move between at least one restricting position and a release position,
while the pairs of vertical extension sections of the pair of fall restricting members are at the at least one restricting position, the pairs of vertical extension sections overlap the stored article in a second direction view along the second direction, and furthermore the lower connecting sections of the pair of fall restricting members overlap the stored article in the vertical view, and
while the pairs of vertical extension sections of the pair of fall restricting members are at the release position, the lower connecting sections of the pair of fall restricting members are outward of the stored article in the first direction in such a manner as not to overlap the stored article in the vertical view.

According to this configuration, the supported sections of the pair of fall restricting members are supported by the cover connecting section that is above the storage space in the vehicle body. Also, the lower connecting sections below the stored article are suspended by the pairs of vertical extension sections that extend downward from the supported sections. For this reason, while the pair of fall restricting members are at the restricting position, even if the article held by the holding section is released unintentionally, the article can be supported by the lower connecting sections of the pair of fall restricting members. Therefore, it is possible to avoid the case where the article falls from the pair of fall restricting members.

Also, while the article is supported by the lower connecting sections in this way, the load of the article acts as a vertical tensile load on the fall restricting members that extend in the up-down direction from the supported sections to the lower connecting sections. In other words, it is possible to avoid the case where a large bending moment acts on the fall restricting members and the support sections that support the fall restricting members. Therefore, even if the article is heavy, it is easy to secure the strength necessary to support the article without significantly increasing the rigidity of the fall restricting members and the support sections. Also, with this configuration, it is possible to reduce the size and the weight of the fall restricting members and the support sections.

Also, according to the above configuration, while the pair of fall restricting members are at the restricting position, the vertical extension sections overlap the stored article in the second direction view. Therefore, it is possible to prevent the article from entirety or partially falling off in the second direction.

In this way, according to the above configuration, it is possible to realize an article transport vehicle provided with a fall restricting device having a structure that facilitates ensuring strength regardless of the weight of the article.

Further features and advantages of the article transport vehicle will become apparent from the following description of exemplary and non-limiting embodiments, which are described with reference to the drawings.

BRIEF DESCRIPTION OF THE DRAWINGS

FIG. 11 is a plan view schematically showing a driving mechanism of a fall restricting device according to another embodiment.

DESCRIPTION OF THE INVENTION

An embodiment in which an article transport vehicle 1 is applied in an article transport facility 100 will be described below with reference to the drawings. In the present embodiment, as shown in FIG. 1, the article transport facility 100 includes the article transport vehicle 1, which travels along a travel route 3, and a processing device 10 that processes a stored item stored in an article W.

Figure 1:
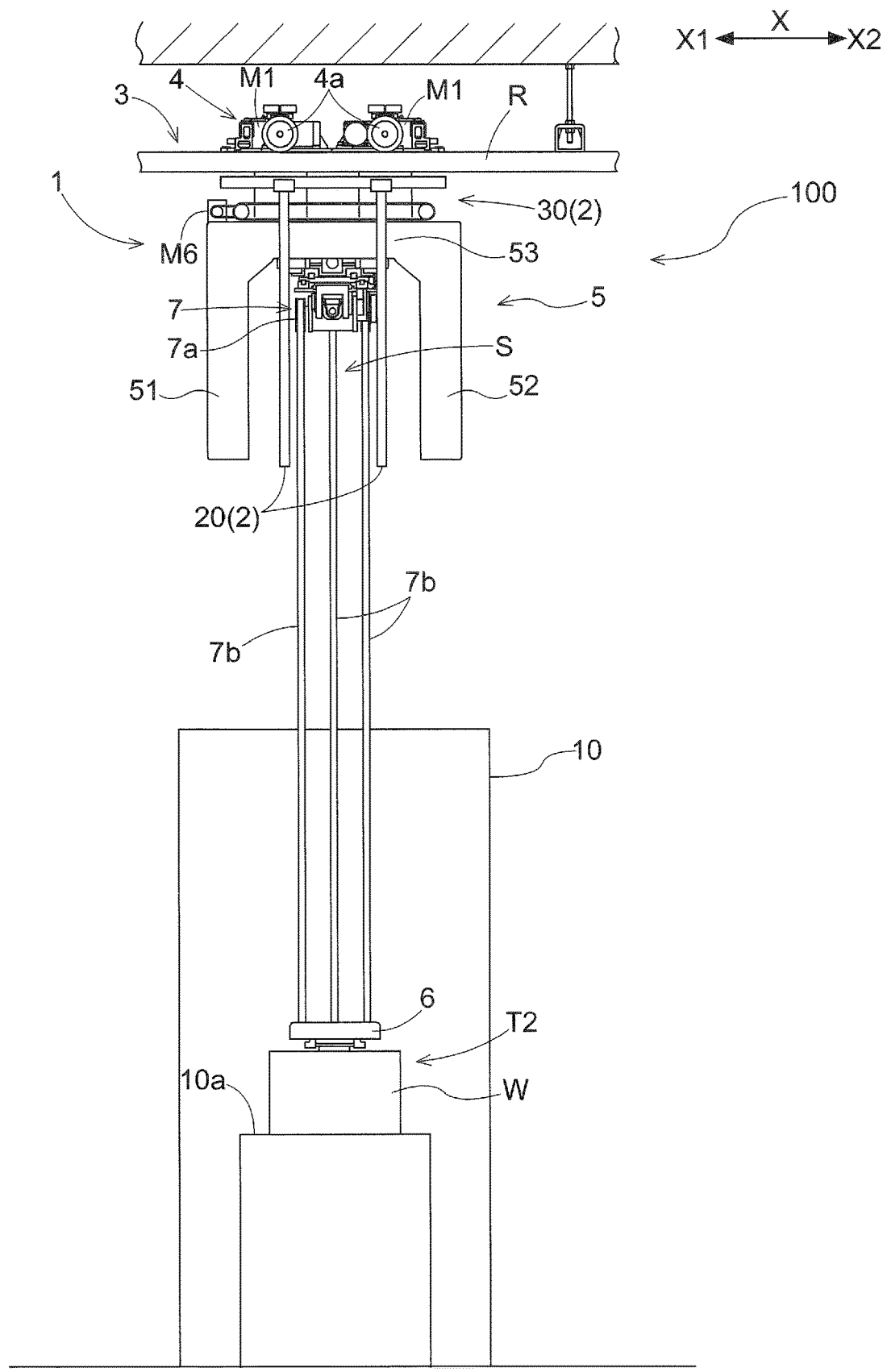
FIG. 1 is a side view of an article transport facility.
Figure 2:
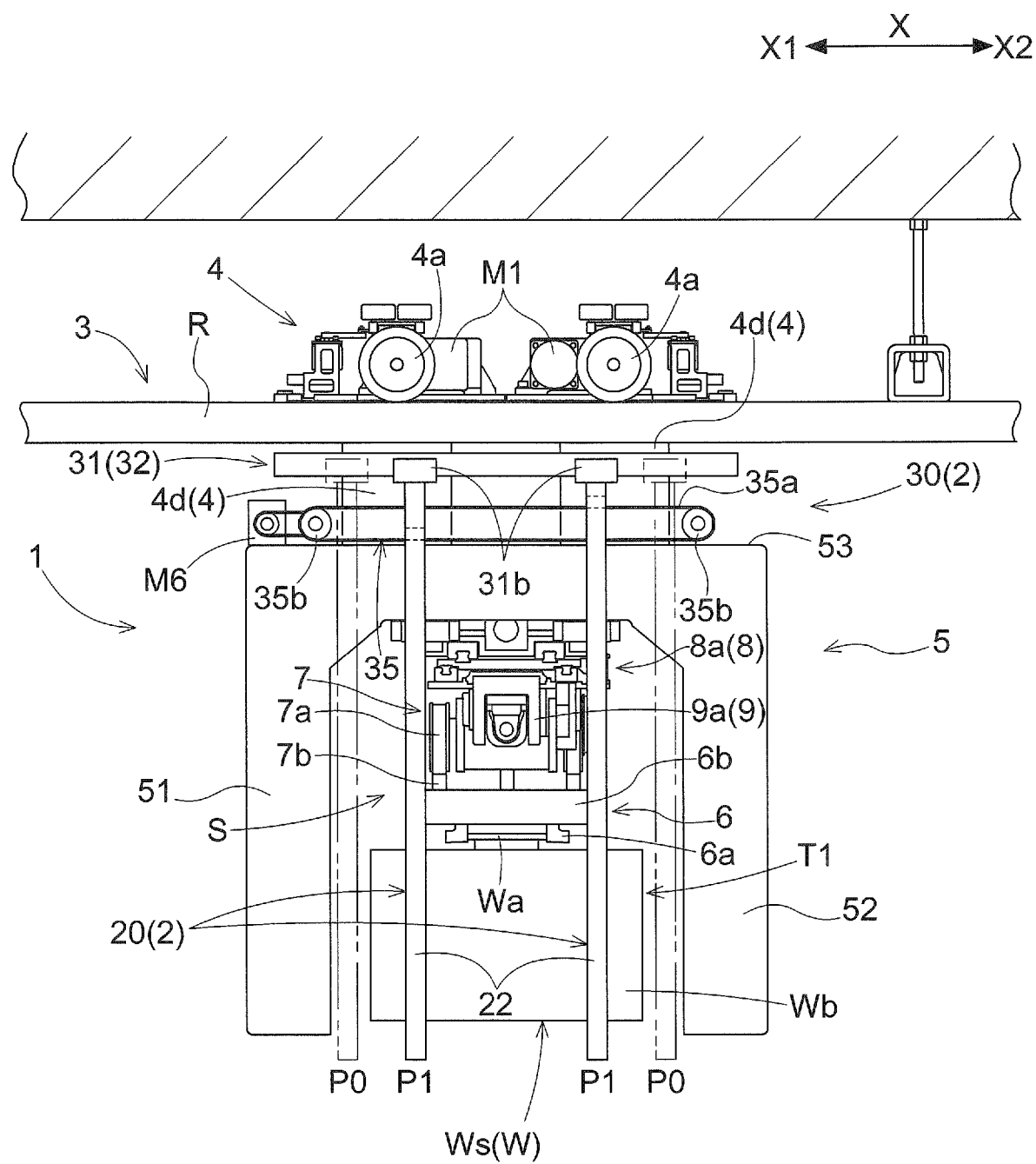
FIG. 2 is a side view of an article transport vehicle.

As shown in FIGS. 1 and 2, the article transport vehicle 1 transports an article W. In the present embodiment, the article transport vehicle 1 transports the article W by moving along the travel route 3. In this example, the travel route 3 is arranged along the ceiling, and rails R are provided along the travel route 3. In other words, the article transport vehicle 1 transports the article W by traveling along the travel route 3 while being guided by the rails R. Specifically, as shown in FIGS. 1 and 2, the rails R are fixed to the ceiling in a suspended state. In this example, two rails R are provided along the travel route 3. Thus, in this example, the article transport vehicle 1 is an overhead transport vehicle that travels while being guided by the pair of rails R suspended from the ceiling. Note that the article transport vehicle 1 is not limited to being an overhead transport vehicle.

In this example, the article transport facility 100 is provided with a plurality of processing devices 10 (only one of them is shown in the example in FIG. 1). The article transport vehicle 1 transports the article W between processing devices 10. Each of the processing devices 10 has a port 10a. The article W to be processed by the processing device 10 is carried in and out through the port 10a. The article transport vehicle 1 stops at a position corresponding to the port 10a on the travel route 3, and transfers the article W to or from the port 10a. In this example, a container for storing a semiconductor substrate (FOUP: Front Opening Unified Pod) is the article W that is transported. Also, the semiconductor substrate stored in the article W is processed in the processing device 10. Note that beside an FOUP, the article W may also be a reticle storage container (so-called reticle pod) that stores a reticle, for example.

The configuration of the article transport vehicle 1 will be described in detail below with reference to FIGS. 1 to 7. In the following description, a first direction X is a specific direction in the horizontal plane, a second direction Y is the direction perpendicular to the first direction X in a vertical view, a first side X1 is one side in the first direction X, and a second side X2 is the other side in the first direction X. In this example, the second direction Y is the horizontal direction perpendicular to the first direction X.

As shown in FIGS. 1 and 2, the article transport vehicle 1 includes a traveling section 4 that is provided with wheels 4a, a vehicle body 5 that is coupled to the traveling section 4 and forms a storage space S for storing an article W, a holding section 6 that holds an article W in a suspended state, an elevating section 7 that raises and lowers the holding section 6 relative to the vehicle body 5 so as to raise and lower the article W held by the holding section 6 between a storage position T1 in the storage space S and a lowered position T2 below the storage space S, and a fall restricting device 2 that restricts the falling of a stored article Ws, which is an article W at the storage position T1. In the present embodiment, the article transport vehicle 1 further includes a slide section 8 for sliding the article W held by the holding section 6 in the horizontal direction, and a control device H.

As shown in FIGS. 1 and 2, the traveling section 4 includes the wheels 4a that roll on the rails R, and a traveling motor M1 that drives the wheels 4a. In the illustrated example, the traveling section 4 includes a plurality of wheels 4a. The traveling motor M1 drives at least one of the wheels 4a to provide driving force for moving the article transport vehicle 1 while being guided by the pair of rails R. Note that in the present embodiment, the first direction X is a direction along the traveling direction of the traveling section 4, as shown in FIGS. 1 and 2. In other words, the direction along the travel route 3 is the first direction X, and the article transport vehicle 1 travels along the first direction X.

The holding section 6 includes a pair of gripping claws 6a and a holding motor M2 (see FIG. 7) for moving the pair of gripping claws 6a toward and away from each other. The holding section 6 moves the pair of gripping claws 6a toward or away from each other by driving the holding motor M2, thereby switching between a gripping state in which the pair of gripping claws 6a grip the article W and a release state in which the gripped article W is released. In this example, as shown in FIG. 2, the article W includes an article body section Wb and a holding target section Wa provided above the article body section Wb. The holding section 6 holds the article W in a suspended state by holding the holding target section Wa of the article W, or more specifically, by gripping the holding target section Wa with the pair of gripping claws 6a.

The slide section 8 includes a slide body 8a that moves along the second direction Y relative to the traveling section 4, and a slide motor M4 (see FIG. 7) that moves the slide body 8a along the second direction Y. The slide section 8 moves the slide body 8a along the second direction Y by driving the slide motor M4, thereby moving the elevating section 7, the holding section 6, and the article W held by the holding section 6 in the second direction Y. For example, if the port 10a of the processing device 10 is arranged at a position shifted in the second direction Y relative to the travel route 3, by moving the article W held by the holding section 6 along the second direction Y, the article W can be moved to a position overlapping the port 10a when viewed in the vertical direction. As a result, the article W can be appropriately transferred to the port 10a by the elevating section 7.

When the article transport vehicle 1 is to move along the travel route 3, the elevating section 7 raises the article W held by the holding section 6 from the lowered position T2 to the storage position T1. Also, when the article W is to be transferred between the article transport vehicle 1 and the port 10a, the elevating section 7 lowers the article W held by the holding section 6 from the storage position T1 to the lowered position T2. In this example, as shown in FIGS. 1 and 2, the elevating section 7 includes a pulley 7a supported by the slide body 8a, a belt 7b wound around the pulley 7a and having a leading end that is connected to the holding section 6, and an elevating motor M3 (see FIG. 7) that rotates the pulley 7a and drives the belt 7b. The elevating section 7 winds up the belt 7b by rotating the pulley 7a in the normal direction by driving the elevating motor M3, thereby raising the holding section 6 and the article W held by the holding section 6 relative to the vehicle body 5. Also, the elevating section 7 feeds out the belt 7b by rotating the pulley 7a in the reverse direction by driving the elevating motor M3, thereby lowering the holding section 6 and the article W held by the holding section 6 relative to the vehicle body 5. By raising and lowering the article W in this way, the article transport vehicle 1 transfers the article W to and from the port 10a.

As shown in FIGS. 1 and 2, the vehicle body 5 is arranged below the traveling section 4 in the present embodiment. In this example, the vehicle body 5 is suspended by the traveling section 4. Specifically, the traveling section 4 is arranged above the rails R, and the vehicle body 5 is arranged below the rails R. Also, in the present embodiment, the vehicle body 5 is shaped such that at least one side in the second direction Y relative to the storage space S is open. In this example, the vehicle body 5 has a shape in which both sides in the second direction Y and the lower side relative to the storage space S are open. The specific configuration of the vehicle body 5 will be described below.

As shown in FIGS. 1 to 3 and 6, the vehicle body 5 includes a first cover section 51 that covers the storage space S on the first side X1 of in the first direction, a second cover section 52 that covers the storage space S on the second side X2 in the first direction, and a cover connecting section 53 that connects the first cover section 51 and the second cover section 52 above the storage space S. The storage space S is formed so as to be surrounded by the first cover section 51, the second cover section 52, and the cover connecting section 53. In the present embodiment, the first cover section 51 and the second cover section 52 are arranged so as to face certain faces of the article W held by the holding section 6 and stored in the storage space S (i.e., the stored article Ws), specifically the faces that face the first direction X. The two sides of the storage space S in the second direction Y and the lower side thereof are not covered by such cover sections, and are open. For this reason, the stored article Ws can be slid outward toward both sides in the second direction Y relative to the storage space S by the slide section 8. Similarly, the stored article Ws can be raised and lowered between the storage position T1 and the lowered position T2 by the elevating section 7. Also, in the present embodiment, the cover connecting section 53 is connected to the traveling section 4 as shown in FIGS. 1 and 2. In this example, the article transport vehicle 1 further includes connecting bodies 4d, and the cover connecting section 53 is connected to the traveling section 4 via the connecting bodies 4d (see FIGS. 2 and 3). Also, as shown in FIG. 2, the elevating section 7, the slide section 8, and the holding section 6 are arranged below the cover connecting section 53, and are also supported by the traveling section 4 via the connecting bodies 4d. Therefore, the storage space S for storing the article W is formed below the region where the elevating section 7, the slide section 8, and the holding section 6 are arranged.

The fall restricting device 2 is a device for avoiding the case where the article W falls from the article transport vehicle 1 even if the stored article Ws held by the holding section 6 is released unintentionally while the article transport vehicle 1 is traveling. The specific configuration of the fall restricting device 2 will be described below.

As shown in FIGS. 1 to 5, the fall restricting device 2 includes a pair of fall restricting members 20 and a driving mechanism 30 that drives the pair of fall restricting members 20. In the present embodiment, the pair of fall restricting members 20 are provided on the cover connecting section 53. Also, the pair of fall restricting members 20 are spaced apart from each other in the first direction X. The pair of fall restricting members 20 support the article W if the article Ws held by the holding section 6 is released, thereby preventing the article W from falling below the storage space S.

As shown in FIGS. 2 to 6, the pair of fall restricting members 20 each include a supported section 21 supported by the cover connecting section 53, a pair of vertical extension sections 22 that extend downward from the supported section 21 on opposite sides of the stored article Ws in the second direction Y, and a lower connecting section 24 that connects the pair of vertical extension sections 22 below the stored article Ws. In the present embodiment, the pair of fall restricting members 20 are arranged such that the two sides in the second direction Y and the lower side relative to the storage space S are surrounded by the supported sections 21, the pair of vertical extension sections 22, and the lower connecting section 24. In this example, the supported sections 21, the pair of vertical extension sections 22, and the lower connecting section 24 are arranged outside the storage space S. Note that in this example, the two fall restricting members 20 have the same structure as each other. For this reason, the configuration of one of the two fall restricting members 20 will be described below, and a description will not be given for the other one. Note that the pair of fall restricting members 20 may have different structures.

Figure 3:
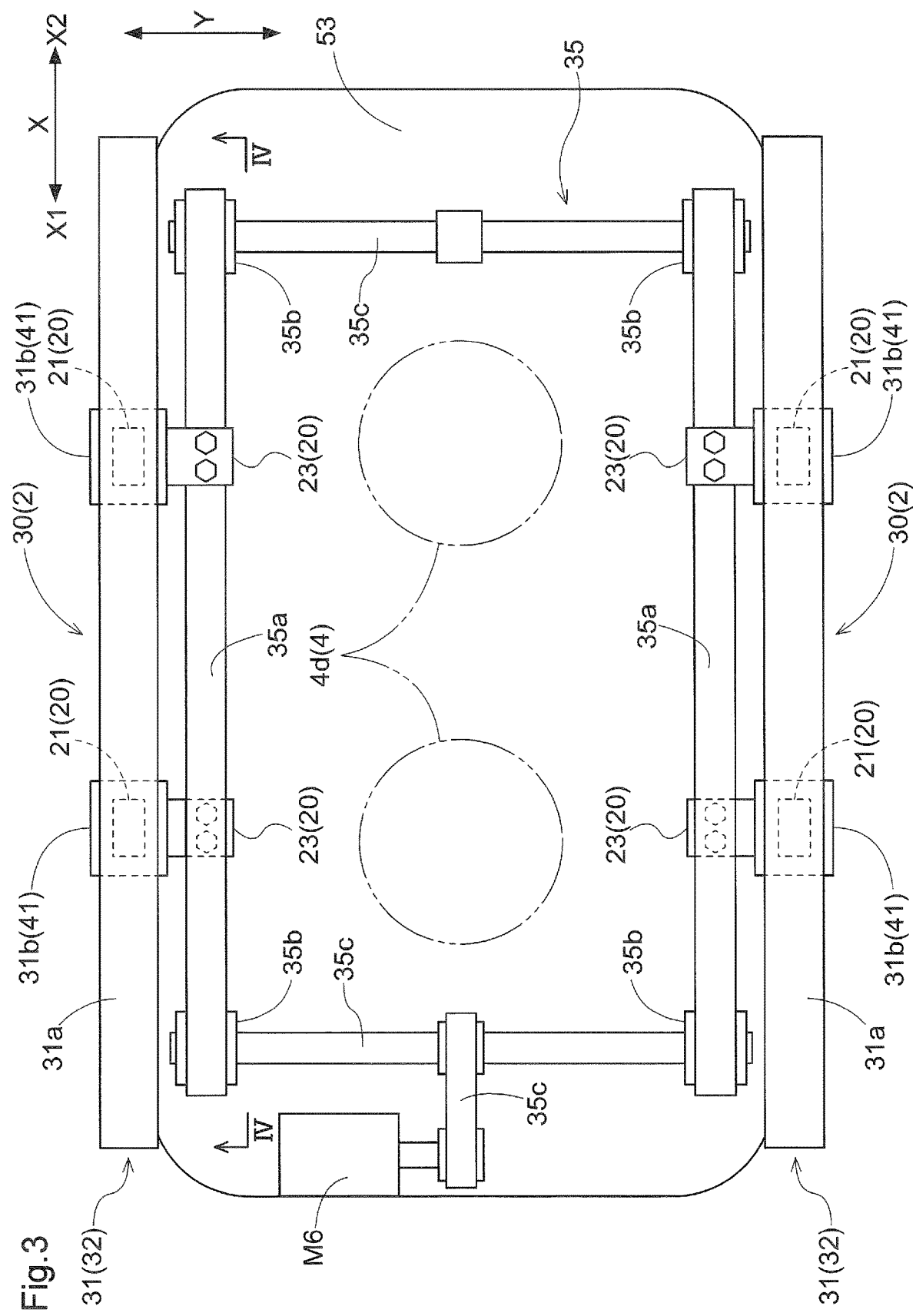
FIG. 3 is a plan view schematically showing a driving mechanism of a fall restricting device.
Figure 4:
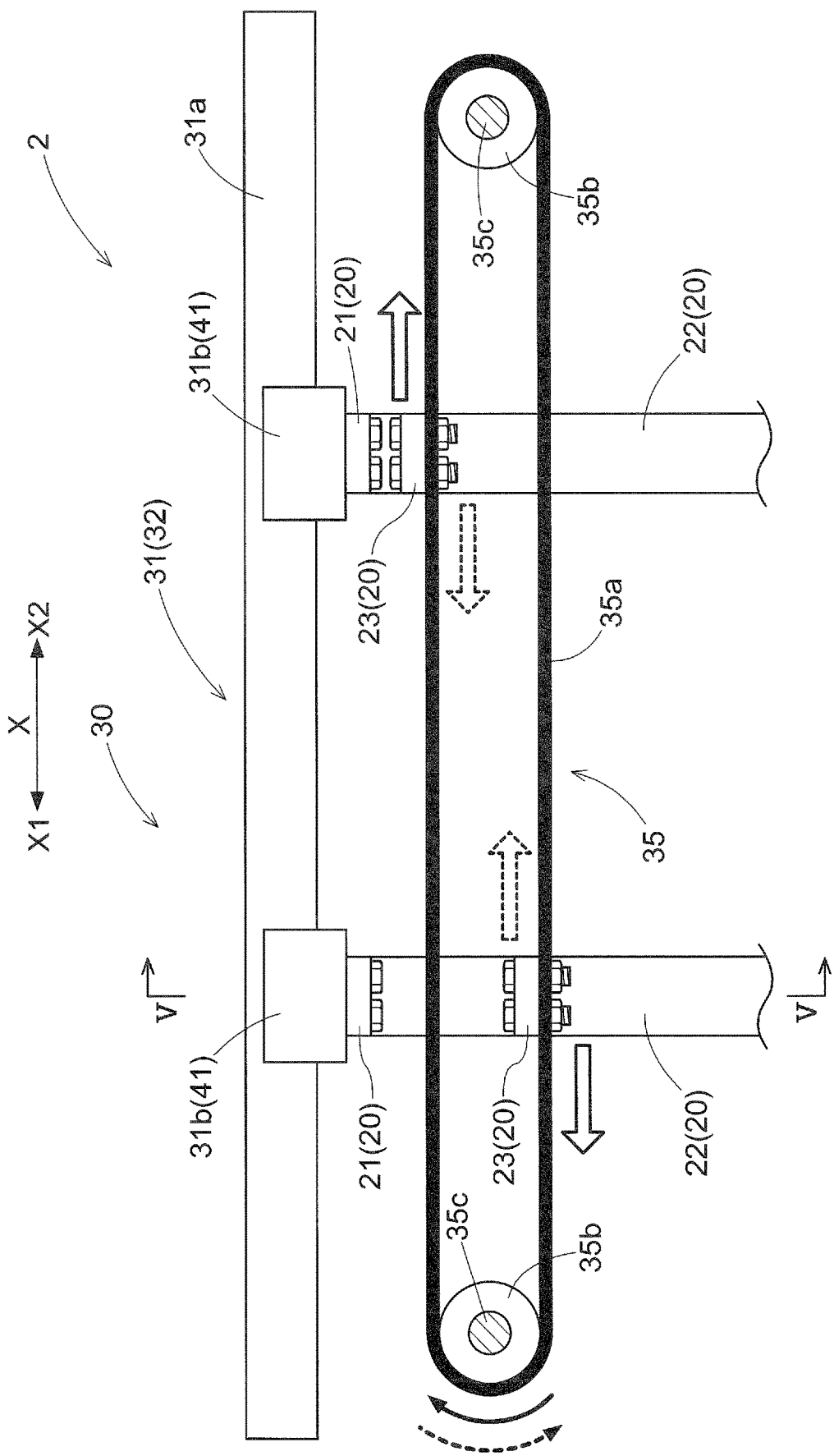
FIG. 4 is a schematic side view (cross-sectional view taken along IV-IV in FIG. 3) of a driving mechanism of the fall restricting device.
Figure 5:
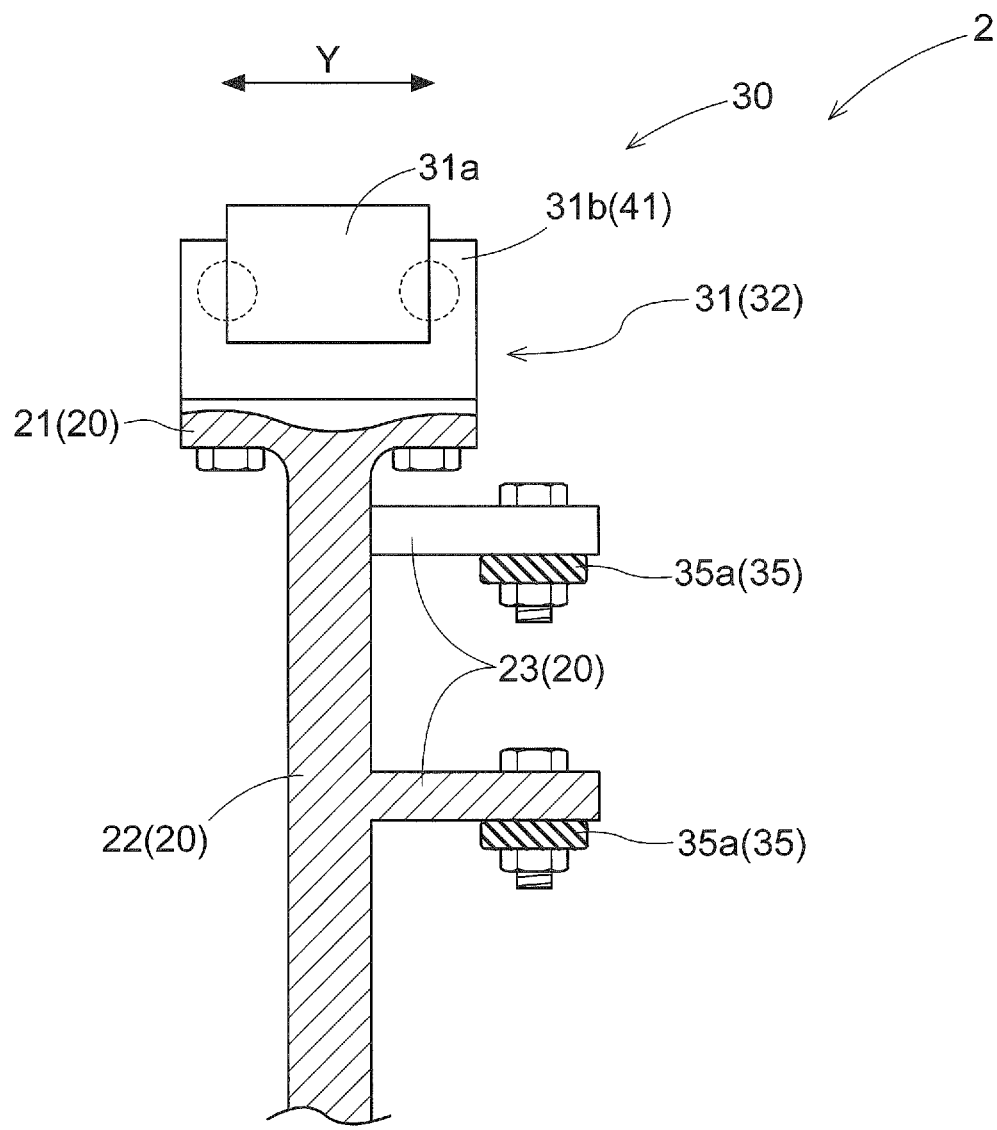
FIG. 5 is a schematic front view (cross-sectional view taken along V-V in FIG. 4) of the driving mechanism of the fall restricting device.

In the present embodiment, as shown in FIGS. 3 to 5, the supported sections 21 are supported by the cover connecting section 53 via the driving mechanism 30. Also, the supported sections 21 support the pair of vertical extension sections 22 from above. In this example, the fall restricting member 20 includes a pair of supported sections 21 in correspondence with the pair of vertical extension sections 22. The pair of supported sections 21 are spaced apart from each other in the second direction Y (more specifically, on opposite sides of the stored article Ws in the second direction Y). Corresponding vertical extension sections 22 are connected to the pair of supported sections 21. In the example shown in FIGS. 4 and 5, the pair of supported sections 21 are connected to a guide section 32 of the driving mechanism 30, which will be described later. The portion of the guide section 32 that is connected to the supported section 21 serves as a support section 41, which will be described later. Details of the configuration of the driving mechanism 30 will be described later.

In the present embodiment, as shown in FIGS. 1, 2, 4 and 5, the pair of vertical extension sections 22 extend along the up-down direction. Also, the pair of vertical extension sections 22 are arranged so as to overlap each other when viewed in the second direction Y. Note that the term "overlap" includes not only the case where regions completely overlap each other, but also the case where regions partially overlap each other. In this example, as described above, the pair of supported sections 21 respectively support the corresponding vertical extension sections 22 from above. Specifically, the upper end of each of the vertical extension sections 22 is connected to the corresponding supported section 21. The vertical extension sections 22 extend downward from the supported sections 21. Also, the lower ends of the vertical extension sections 22 are located below the bottom surface of the stored article Ws. In the example in FIGS. 2, 4, and 5, the vertical extension sections 22 are each a plate-like member that extends along the up-down direction. At a restricting position P1, which will be described later, the pair of vertical extension sections 22 face certain faces of the article body section Wb of the stored article Ws, namely the faces that face the second direction Y. Also, the lower ends of the pair of vertical extension sections 22 are located at positions that are below the bottom surface of the stored article Ws and below the lower ends of the first cover section 51 and the second cover section 52 (i.e., below the storage space S). Note that the lower ends of the pair of vertical extension sections 22 may be located in the storage space S as long as they are below the bottom surface of the stored article Ws. In this case, the lower ends of the pair of vertical extension sections 22 are located at positions that are below the bottom surface of the stored article Ws and above the lower ends of the first cover section 51 and the second cover section 52. Note that in this example, the pair of vertical extension sections 22 have the same structure as each other, but may have different structures. Even in such a case, it is preferable that the lower ends of the pair of vertical extension sections 22 are at the same position as each other in the up-down direction.

Note that in this example, the pair of two vertical extension sections 22 are arranged in an orientation extending along the up-down direction, but may be arranged in an orientation inclined relative to the up-down direction, for example.

Figure 6:
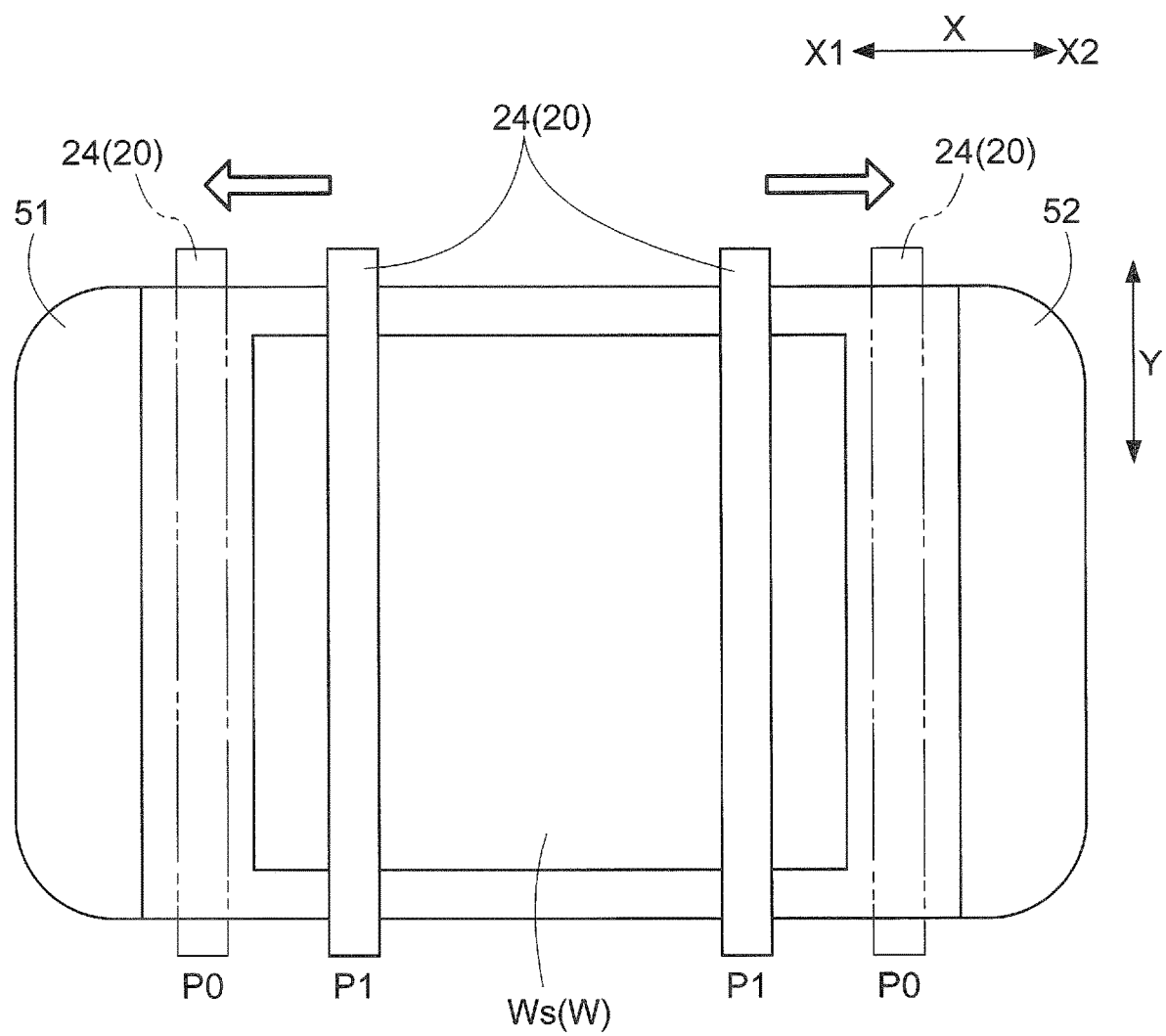
FIG. 6 is a bottom view schematically showing a body and lower connecting sections of a pair of fall restricting members.

In the present embodiment, as shown in FIG. 6, the lower connecting section 24 connects the lower ends of the pair of vertical extension sections 22. In other words, the lower connecting section 24 is supported from above by the pair of vertical extension sections 22. In other words, the lower connecting section 24 is supported from above by the pair of supported sections 21 via the pair of vertical extension sections 22. Also, the lower connecting section 24 is arranged below the bottom surface of the stored article Ws and extends along the second direction Y. In the illustrated example, the lower connecting section 24 is a plate-like member that extends along the horizontal plane. At the restricting position P1, which will be described later, the lower connecting sections 24 of the pair of fall restricting members 20 are arranged so as to face the downward facing surface of the article body section Wb of the stored article Ws. Note that in this example, the lower connecting section 24, the vertical extension sections 22, and the supported section 21 are integrated with each other, but they may be formed separately.

As shown in FIG. 2, the driving mechanism 30 drives the pair of fall restricting members 20 to move them between the restricting position P1 and a release position P0. Here, the restricting position P1 is a position at which the pair of fall restricting members 20 can prevent an article W that was released by the holding section 6 from falling below the storage space S. In other words, the restricting position P1 is the position at which the pair of fall restricting members 20 can support an article W released by the holding section 6 from below. Also, the release position P0 is a position at which the pair of fall restricting members 20 are located when the article transport vehicle 1 transfers the article W to or from the port 10a. At the release position P0, the pair of fall restricting member 20 are positioned so as not to interfere with the elevating section 7, the holding section 6, and the slide section 8 that perform transfer to or from the port 10a, and the article W held by the holding section 6. In the present embodiment, when the article transport vehicle 1 is to transfer the article W to or from the port 10a, the driving mechanism 30 moves the pair of fall restricting members 20 from the restricting position P1 to the release position P0. Then, when the article transport vehicle 1 holds the article W and is to travel along the travel route 3, the driving mechanism 30 moves the pair of fall restricting members 20 from the release position P0 to the restricting position P1. In the present embodiment, as shown in FIG. 2, the driving mechanism 30 moves the supported sections 21 of the pair of fall restricting members 20 in the first direction X. Accordingly, the pair of fall restricting members 20 are arranged at either the restricting position P1 or the release position P0. In this example, the driving mechanism 30 moves the supported sections 21, which are spaced apart from each other in the first direction X, so as to move toward and away from each other in the first direction X. Also, in this example, when the supported sections 21 (here, the pair of supported sections 21) move in the first direction X, the pair of vertical extension sections 22 and the lower connecting sections 24 also move in the first direction X together with the supported sections 21. In other words, the driving mechanism 30 moves the entirety of the fall restricting members 20 in the first direction X, and causes the pair of fall restricting members 20 to move toward and away from each other. The restricting position P1 and the release position P0 will be described in detail below.

As shown in FIGS. 2 and 6, at the restricting position P1, the pairs of vertical extension sections 22 of the pair of fall restricting members 20 overlap the stored article Ws in a second direction Y view along the second direction Y, and the lower connecting sections 24 of the pair of fall restricting members 20 overlap the stored article Ws in a vertical view. In the present embodiment, at the restricting position P1, the pair of fall restricting members 20 are arranged at positions inward a predetermined distance from the two ends in the first direction X of the article body section Wb of the stored article Ws. In other words, the pairs of vertical extension sections 22 and the lower connecting sections 24 of the pair of fall restricting members 20 are arranged inward a predetermined distance from the two ends in the first direction X of the article body section Wb of the stored article Ws. The predetermined distance is set such that the pair of fall restricting members 20 are arranged at positions (the restricting position P1) where they can appropriately support the article W. In this example, at the restricting position P1, the pair of vertical extension sections 22 partially (in the illustrated example, regions below the centers of the vertical extension sections 22) overlap the stored article Ws in a second direction Y view, and the lower connecting sections 24 partially (specifically, regions of the lower connecting sections 24 other than the two end portions in the second direction Y) overlap the stored article Ws in a vertical view.

Furthermore, in this example, as described above, at the restricting position P1, the pair of vertical extension sections 22 are arranged to face certain faces of the article body section Wb of the stored article Ws, namely the faces that face the second direction Y (see FIG. 2). Also, at the restricting position P1, the lower connecting sections 24 are arranged so as to face the bottom surface of the article body section Wb of the stored article Ws (see FIG. 6). Since the restricting position P1 is set such that the pair of fall restricting members 20 are arranged as described above, even if the stored article Ws held by the holding section 6 is released unintentionally, the released article W falls onto the lower connecting sections 24 of the pair of fall restricting members 20, and is appropriately supported by the lower connecting sections 24. Therefore, it is possible to prevent the article W from falling below the storage space S. Furthermore, even if the released article W moves to one side in the second direction Y due to centrifugal force or the like generated when the article transport vehicle 1 travels along a curved route in the travel route 3, for example, the article W comes into contact with the vertical extension sections 22 on one side in the second direction Y of the fall restricting members 20, thus making it possible to avoid a situation in which the article W falls below the storage space S from one side in the second direction Y.

As shown in FIGS. 2 and 6, at the release position P0, the lower connecting sections 24 of the pair of fall restricting members 20 are located outward of the stored article Ws in the first direction X so as not to overlap the stored article Ws in a vertical view. In the present embodiment, at the release position P0, the pairs of vertical extension sections 22 of the pair of fall restricting members 20 are located outward of the stored article Ws in the first direction X so as not to overlap the stored article Ws in a second direction Y view. In this example, at the release position P0, the pair of fall restricting members 20 are located outward a predetermined distance from the two sides in the first direction X of the article body section Wb of the stored article Ws. For this reason, at the release position P0, the pair of vertical extension sections 22 are arranged so as to overlap the storage space S and not overlap the stored article Ws in the second direction Y view. Also, at the release position P0, the lower connecting sections 24 of the pair of fall restricting members 20 are arranged so as to overlap the storage space S and not overlap the stored article Ws in a vertical view. For this reason, the article W held by the holding section 6 does not interfere with the lower connecting sections 24 of the pair of fall restricting members 20 when being raised or lowered between the storage position T1 and the lowered position T2, for example. Similarly, the article W held by the holding section 6 does not interfere with the pairs of vertical extension sections 22 of the pair of fall restricting members 20 when sliding in the second direction Y.

As described above, in this example, the pair of fall restricting members 20 move in opposite directions in the first direction X when moving from the restricting position P1 to the release position P0. In other words, the release positions P0 corresponding to the pair of fall restricting members 20 are set on opposite sides of the stored article Ws in the first direction X. However, the release positions P0 corresponding to the pair of fall restricting members 20 may be set on one side of the stored article Ws in the first direction X. In this case, the pair of fall restricting members 20 move toward the same side in the first direction X when moving from the restricting position P1 to the release position P0.

As shown in FIGS. 2 to 5, in the present embodiment, the driving mechanism 30 includes guide sections 32 that guide movement in the first direction X of the supported sections 21 of the pair of fall restricting members 20, and a driving section 35 for moving the supported sections 21 toward opposite sides in the first direction X in each pair of supported sections 20. In this example, the guide sections 32 and the driving section 35 are provided on the cover connecting section 53 (the upper face of the cover connecting section 53 in the example in FIG. 3).

In this example, as shown in FIGS. 2 to 5, the guide sections 32 include linear motion guide mechanisms 31. The linear motion guide mechanisms 31 extend along the first direction X, and the supported sections 21 of the pair of fall restricting members 20 are connected to the linear motion guide mechanisms 31. In this manner, the pair of fall restricting members 20 move in the first direction X while being guided by the linear motion guide mechanisms 31. In the example in FIG. 3, a pair of linear motion guide mechanisms 31 are spaced apart from each other in the second direction Y. Each of the two linear motion guide mechanisms 31 includes a guide body 31a and a plurality of (here, two) moving bodies 31b. The guide body 31a is arranged such that the moving bodies 31b move along the first direction X. The pairs of supported sections 21 of the pair of fall restricting members 20 are fixed to the moving bodies 31b. In the example in FIGS. 4 and 5, the supported sections 21 are supported by the moving bodies 31b by being fixed to the moving bodies 31b from above. In other words, the moving bodies 31b of the linear motion guide mechanisms 31 function as the support sections 41 that support the supported sections 21. Although the linear motion guide mechanisms 31 are linear guides here, various known linear motion guide mechanisms such as a ball spline and a linear bush can also be used, for example.

Also, in this example, as shown in FIGS. 2 to 4, the driving section 35 includes a plurality of pulleys 35b supported by the cover connecting section 53, drive belts 35a that are wound around the pulleys 35b and connected to the linear motion guide mechanisms 31, and a fall restriction drive motor M6 that rotates the pulleys 35b to drive the drive belts 35a. In the example in FIG. 4, the drive belts 35a are each wound around a plurality of (here, two) pulleys 35b spaced apart from each other in the first direction X. One of the two fall restricting members 20 is connected to the horizontal section of the lower portion of the drive belt 35a, and the other fall restricting member 20 is connected to the horizontal section of the upper portion of the drive belt 35a. Specifically, the fall restricting members 20 are connected to the drive belt 35a via belt support sections 23 provided on the upper portion of the vertical extension sections 22. By rotating the pulleys 35b in the same direction, the pair of fall restricting members 20 move toward or away from each other. In the example in FIG. 3, a pair of such drive belts 35a are provided in correspondence with the pair of linear motion guide mechanisms 31. The drive belts 35a and the pulleys 35b are connected to the one fall restriction drive motor M6 via a transmission mechanism 35c. The transmission mechanism 35c transmits driving force from the fall restriction drive motor M6 to the pulleys 35b. The drive belts 35a rotate together with the rotation of the pulleys 35b, thereby moving the pair of fall restricting members 20 toward and away from each other.

Figure 7:
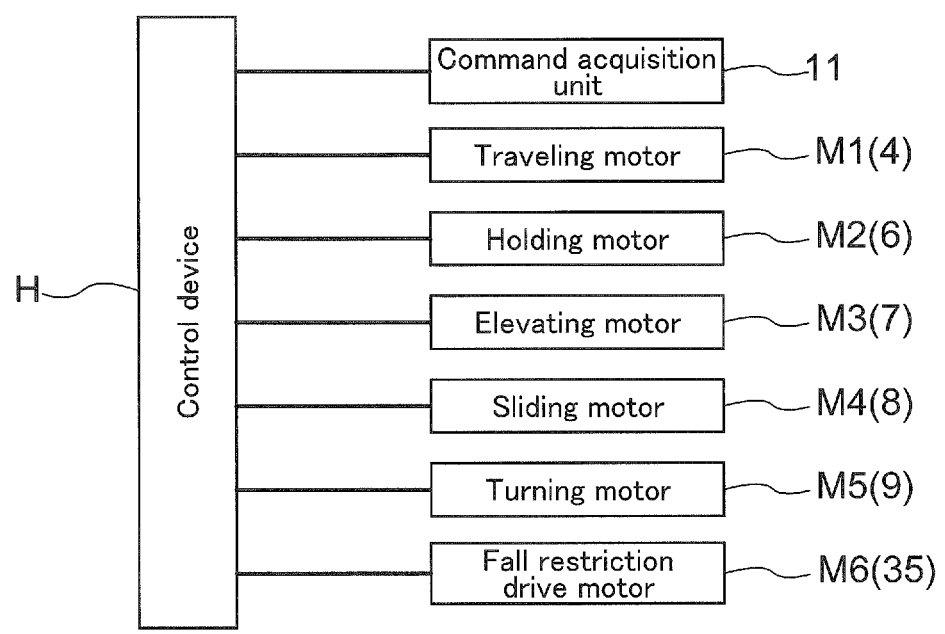
FIG. 7 is a control block diagram.

In the present embodiment, as shown in FIG. 7, the control device H controls the traveling section 4, the holding section 6, the elevating section 7, the slide section 8, and the fall restricting device 2. The control device H includes a processor such as a microcomputer, and also includes peripheral circuits such as a memory, and functions of the control device H are realized by cooperation between such hardware and programs executed on hardware such as the processor. The control device H is communicably connected to a host controller (not shown) that performs overall control of the article transport facility 100. The control device H acquires commands from the host controller (not shown) with a command acquisition unit 11, and controls the traveling section 4, the holding section 6, the elevating section 7, the slide section 8, and the fall restricting device 2 in accordance with the content of the acquired commands.

In this example, the control device H executes transport control for transporting articles W between processing devices 10, and transfer control for transferring articles W to and from the ports 10a.

In transport control, in accordance with a transport command from the host controller, the control device H controls the traveling section 4 (traveling motor M1) so as to cause the article transport vehicle 1 to travel to the processing device 10 to which an article is to be transferred. At that time, the control device H controls the fall restricting device 2 (the fall restriction drive motor M6) such that the pair of fall restricting members 20 are maintained at the restricting position P1. Then, the control device H stops the article transport vehicle 1 at a stop position that corresponds to the port 10a of the processing device 10 that is the transfer destination. Therefore, even if the article W held by the holding section 6 is released unintentionally while the article transport vehicle 1 is traveling, the article W is supported by the lower connecting sections 24 of the pair of fall restricting members 20, thus making it possible to avoid a situation in which the article W falls below the storage space S, that is to say falls from the article transport vehicle 1. Also, even if the released article W moves to one side in the second direction Y due to traveling along a curved route in the travel route 3 or being subjected to an external impact, for example, movement outward in the second direction Y from the storage space S is restricted by the vertical extension sections 22 of the pair of fall restricting members 20, thus making it possible to avoid a situation in which the article W falls toward either side in the second direction Y from the storage space S.

Here, as shown in FIGS. 3, 4, and 5, the pair of fall restricting members 20 are supported from above by the support sections 41 (here, the moving bodies 31b) so as to extend along the up-down direction. The released article W is supported from below by the lower connecting sections 24, which are the lower end portions of the pair of fall restricting members 20. Therefore, compared to a case in which the pair of fall restricting members 20 are supported in a cantilever manner by the first cover section 51 and the second cover section 52, for example, it is possible to avoid a situation in which a large bending moment acts on the support sections 41 that support the fall restricting members 20. Therefore, even if the article W to be transported is heavy, the strength required to support the article W can be easily ensured without greatly increasing the rigidity of the fall restricting members 20 and the members that support them. Accordingly, regardless of the weight of the article W, the pair of fall restricting members 20 are likely to appropriately support the article W when released. Also, it is easy to avoid increasing the size of the fall restricting members 20 and the support sections 41 in order to secure the strength necessary to support the article W.

The control device H executes transfer control on the article transport vehicle 1 stopped at the port 10a where transfer is to be performed. The control device H controls the fall restricting device 2 to move the pair of fall restricting members 20 from the restricting position P1 to the release position P0 when transferring the article W to or from the port 10a. Accordingly, it is possible to avoid a situation in which the article W held by the holding section 6 interferes with the pair of fall restricting members 20 when the article W is transferred between the article transport vehicle 1 and the port 10a. The control device H controls the elevating section 7 (elevating motor M3) so as to raise or lower the article W between the storage position T1 and the lowered position T2 while the pair of fall restricting members 20 are at the release position P0. Here, if the port 10a is located away from the rails R along the travel route 3, the control device H controls the slide section 8 (slide motor M4) to slide the article W in the second direction Y. In this way, the control device H moves the pair of fall restricting members 20 from the restricting position P1 to the release position P0 in the transfer control, thereby making it possible to transfer the article W to or from the port 10a without interference with the pair of fall restricting members 20.

Other Embodiments

Next, other embodiments of the article transport vehicle will be described.

(1) In the above-described embodiment, an example is described in which the fall restricting device 2 includes the pair of fall restricting members 20, but the present invention is not limited to this. For example, the fall restricting device 2 may include three or more fall restricting members 20.

Figure 8:
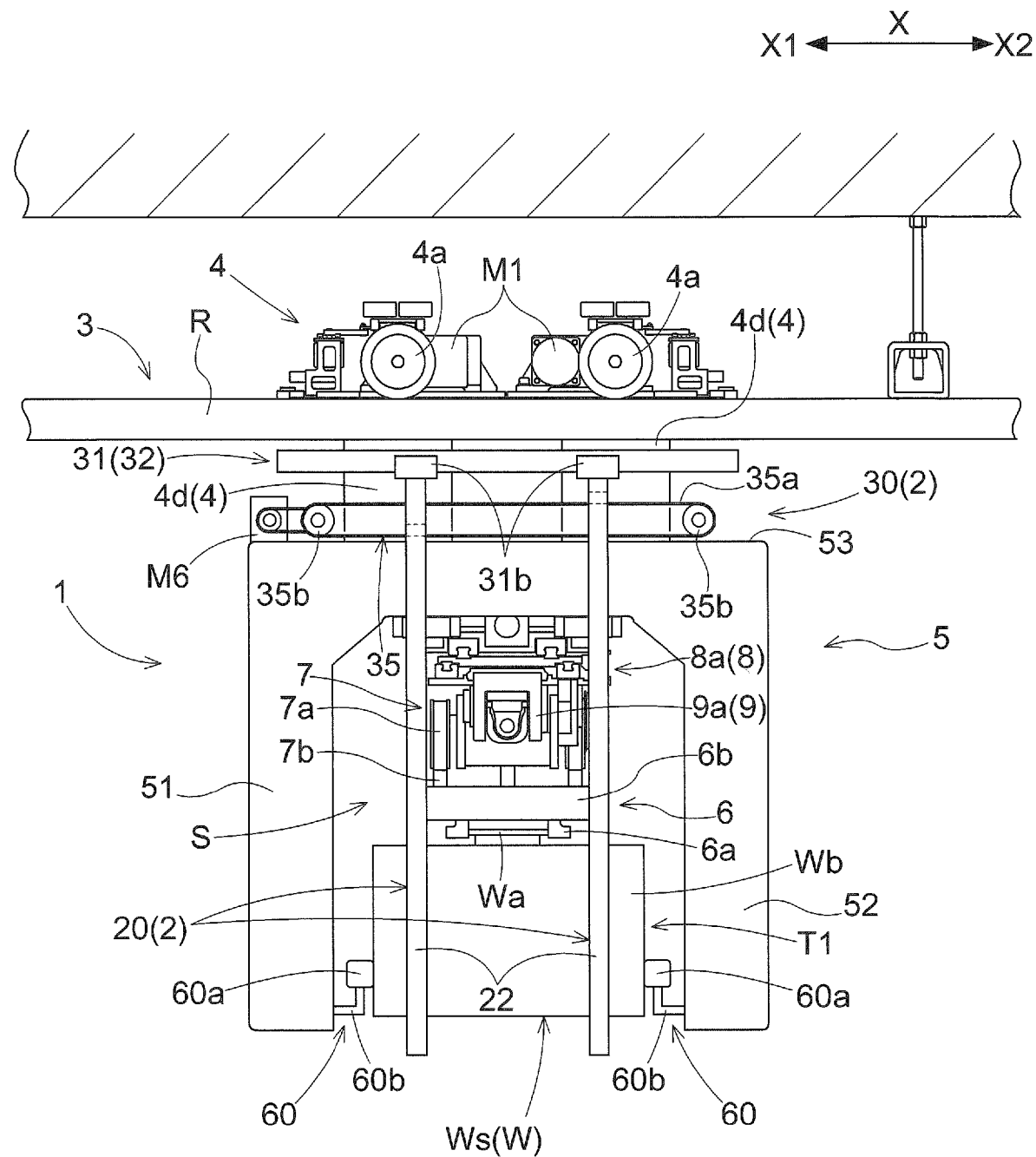
FIG. 8 is a side view of an article transport vehicle according to another embodiment.

(2) In the above-described embodiment, an example is described in which, when transporting the article W, the article transport vehicle 1 moves the pair of fall restricting members 20 from the release position P0 to the restricting position P1 such that even if the stored article Ws held by the holding section 6 is released, the article W can be supported by the lower connecting sections 24 of the pair of fall restricting members 20. However, the present invention is not limited to this configuration, and a configuration is possible in which the article transport vehicle 1 includes a shake preventing mechanism 60 in addition to the pair of fall restricting members 20. Accordingly, vibration generated during travel of the article transport vehicle 1 is absorbed by the shake preventing mechanism 60, and it is possible to suppression the transmission of vibration to the stored article Ws. Therefore, it is possible to avoid damage to the content stored in the stored article Ws caused by vibration. One example of this configuration is shown in FIG. 8. In the example in FIG. 8, the first cover section 51 and the second cover section 52 each include a shake preventing body 60a and a shake preventing body support section 60b that supports the shake preventing body 60a, as the shake preventing mechanism 60. In the illustrated example, the shake preventing body 60a is a roller that rotates around an axis extending in the up-down direction, and the shake preventing body support section 60b, which rotatably supports the roller, is attached to the first cover section 51 and the second cover section 52 while being able to move in the first direction X. When the article transport vehicle 1 travels, the shake preventing body support sections 60b of the first cover section 51 and the second cover section 52 protrude inward in the first direction X in the storage space S and come into contact with side faces (the faces facing the first direction X) of the article body section Wb of the stored article Ws. It is preferable that the drive source for driving the shake preventing mechanisms 60 and the drive source for the driving mechanism 30 for driving the pair of fall restricting members 20 (the fall restriction drive motor M6 in the above embodiment) are the same drive source used in common. Note that the shake preventing bodies 60a may include an elastic member. This makes it possible to more effectively absorb vibration transmitted to the stored article Ws.

Figure 10:
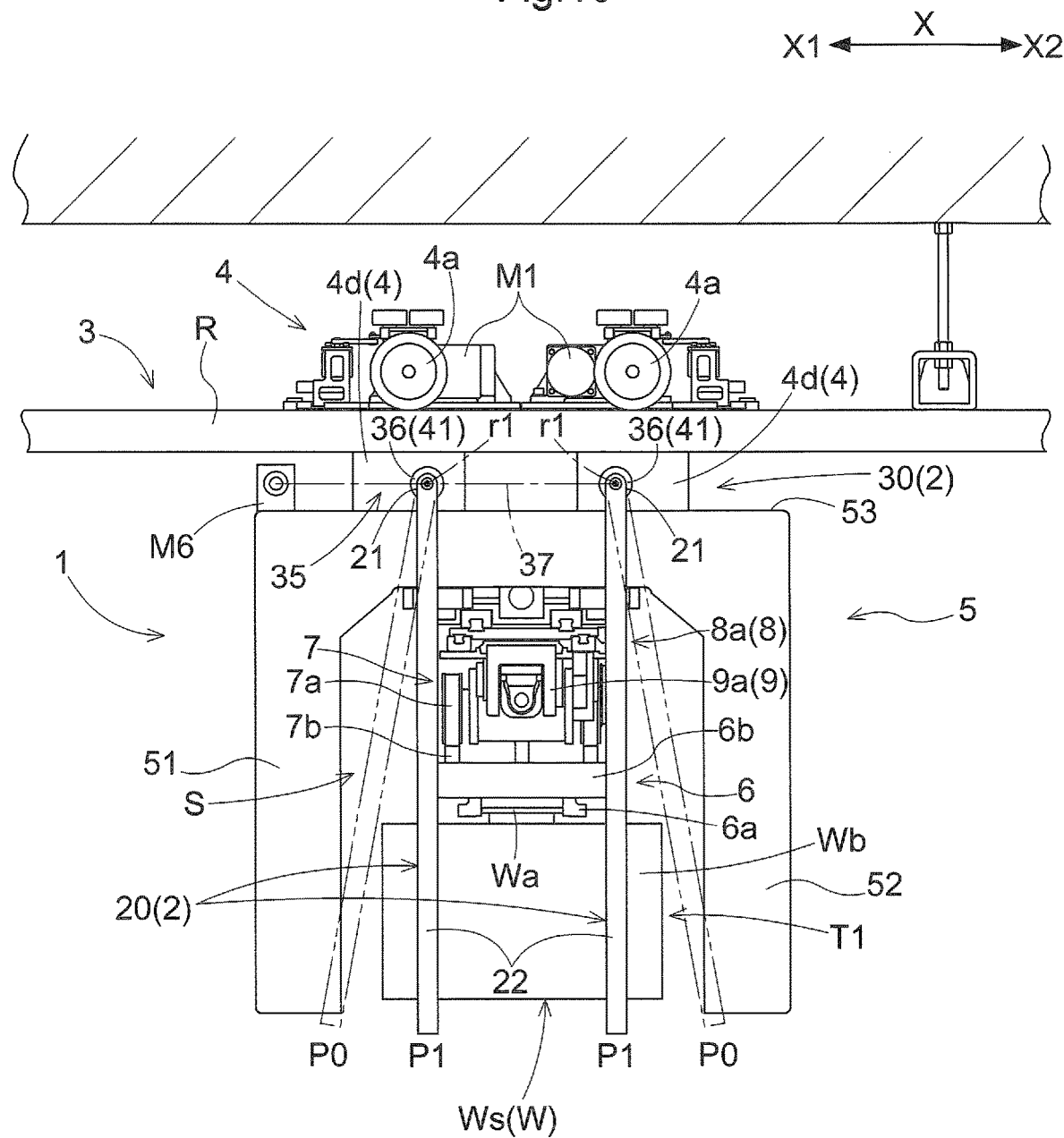
FIG. 10 is a side view of an article transport vehicle according to another embodiment.

(3) In the above-described embodiment, an example is described in which the supported sections 21 of the pair of fall restricting members 20 are moved in the first direction X by the driving mechanism 30 such that the pair of vertical extension sections 20 of the pair of fall restricting members 20 move in the first direction X, and, at the release position P0, the pairs of vertical extension sections 22 of the pair of fall restricting members 20 are located outward of the stored article Ws in the first direction X so as not to overlap the stored article Ws in the second direction Y view, but the present invention is not limited to this. For example, the supported sections 21 of the pair of fall restricting members 20 do not need to move in the first direction X. Also, at the release position P0, the vertical extension sections 22 of the pair of fall restricting members 20 may overlap the stored article Ws in the second direction Y view. One example of this configuration is shown in FIG. 10. In FIG. 10, the driving mechanism 30 includes a pair of rotating bodies 36 that rotate about an axis r1 that extends along the second direction Y. The pair of rotating bodies 36 are spaced apart from each other in the first direction X. The pair of rotating bodies 36 support the pair of supported sections 21 of the pair of fall restricting members 20. In other words, the rotating bodies 36 serve as the support sections 41 that support the supported sections 21. Due to the driving of the fall restriction drive motor M6, the pair of rotating bodies 36 rotate in opposite directions about the axis r1 via a transmission mechanism 37 (simplified in FIG. 10). Accordingly, the pair of fall restricting members 20 pivot about the axis r1 and move between the release position P0 and the restricting position P1. In the illustrated example, at the release position P0, the pairs of vertical extension sections 22 of the pair of fall restricting members 20 do not overlap the stored article Ws, the holding section 6, the elevating section 7, and the slide section 8 in the second direction Y view, but a configuration is possible in which, at the release position P0, the pairs of vertical extension sections 22 of the pair of fall restricting members 20 overlap the stored article Ws in the second direction Y view. For example, such a configuration can be used in the case where the article transport vehicle 1 does not include the slide section 8.

(4) In the above-described embodiment, an example is described in which the driving mechanism 30 includes, as the driving section 35, the plurality of pulleys 35b supported by the cover connecting section 53, the drive belts 35a that are wound around the pulleys 35b and connected to the linear motion guide mechanisms 31, and the fall restriction drive motor M6 that rotates the pulleys 35b to drive the drive belts 35a, but the present invention is not limited to this. For example, a configuration is possible in which the driving mechanism 30 includes, as the driving section 35, a ball screw 36a, nuts 36b screwed onto the ball screw 36a, and interlocking shafts 36c that connect the nuts 36b to the support sections 41 (here, the moving bodies 31b) of the pair of linear motion guide mechanisms 31. One example of this configuration is shown in FIG. 11. In the example in FIG. 11, the ball screw 36a is connected to the fall restriction drive motor M6 and extends along the first direction X. The ball screw 36a is driven to rotate about its axis by the fall restriction drive motor M6. In the illustrated example, the ball screw 36a is provided with male threading portions that spiral in opposite directions on one side and the other side of the central section in the first direction X (traveling direction). Also, the nuts 36b are respectively screwed to the portions of the ball screw 36a whose male threading spirals in different directions. In other words, a pair of the nuts 36b are spaced apart from each other in the first direction X. A pair of the interlocking shafts 36c are also spaced apart from each other in the first direction X. The interlocking shafts 36c connect the nuts 36b to the moving bodies 31b of the pair of linear motion guide mechanisms 31 that face each other in the second direction Y. Therefore, when the ball screw 36a rotates in a first direction, the pair of nuts 36b move toward each other, and when the ball screw 36a rotates in a second direction opposite to the first direction, the pair of nuts 36b move away from each other. As the pair of nuts 36b move toward and away from each other, the pair of fall restricting members 20 move toward and away from each other. Note that a configuration is also possible in which the driving mechanism 30 includes a rack and pinion mechanism as the driving section 35, and moves the pair of fall restricting members 20 in the first direction X using the rack and pinion mechanism.

Figure 9:
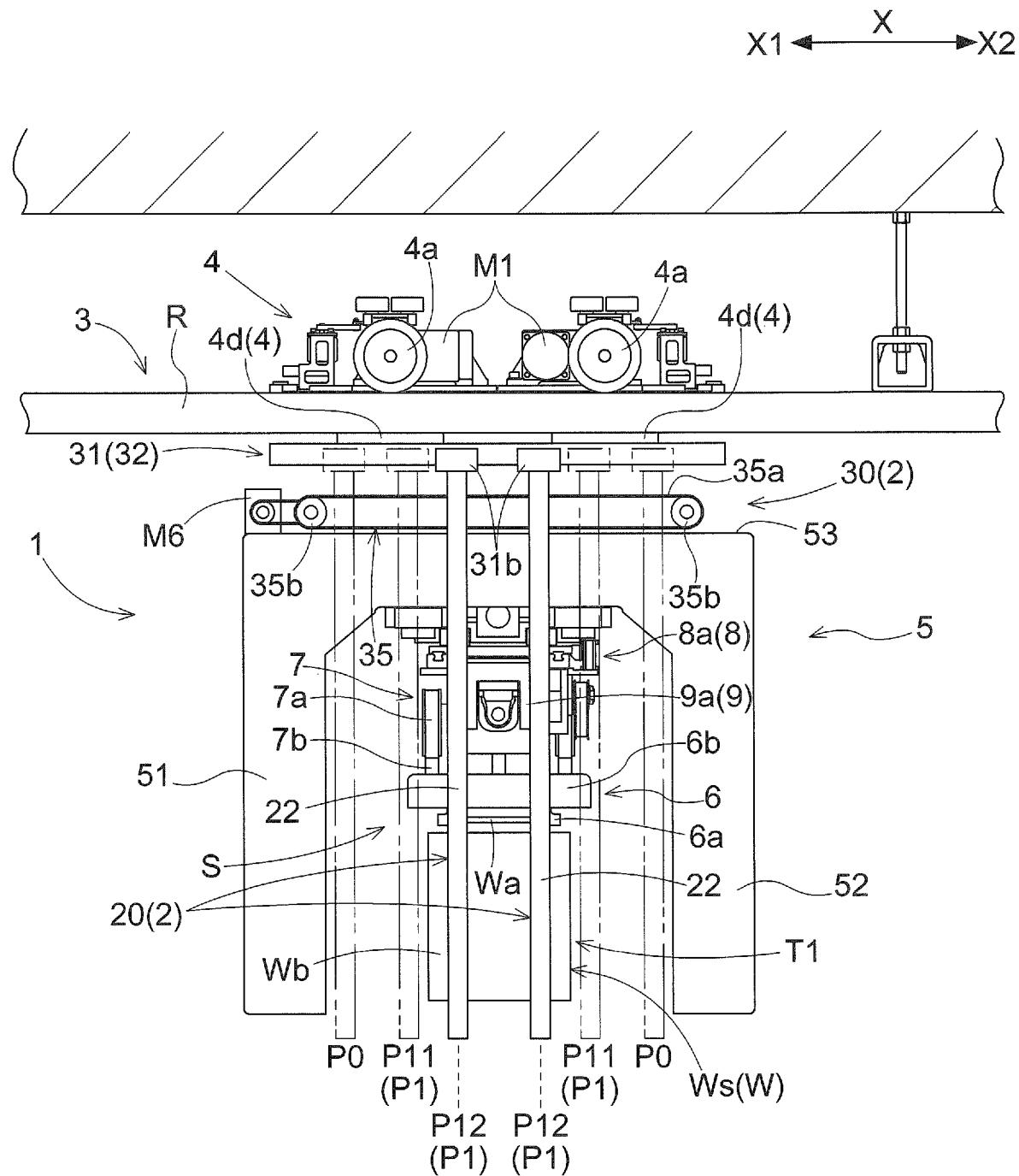
FIG. 9 is a side view of an article transport vehicle according to another embodiment.

(5) In the above-described embodiment, an example is described in which the driving mechanism 30 is configured to move the pair of fall restricting members 20 between one restricting position P1 and the release position P0. However, the present invention is not limited to this configuration. For example, a plurality of restricting positions P1 may be set in the first direction X. In this case, the driving mechanism 30 can move the pair of fall restricting members 20 between the plurality of restricting positions P1 and the release position P0. One example of this configuration is shown in FIG. 9. In the example in FIG. 9, a plurality of (here, two) restricting positions P1 are set according to corresponding sizes of the stored article Ws. More specifically, a plurality of restricting positions P1 are set according to widths in the first direction X of the stored article Ws. In the illustrated example, if the stored article Ws is large, the control device H moves the pair of fall restricting members 20 to a large article restricting position P11 that is closer to the release position P0. If the stored article Ws is small, the control device H moves the pair of fall restricting members 20 to a small article restricting position P12 that is set inward of the large article restricting position P11 in the first direction X. Although two restricting positions P1 are set in the illustrated example, two or more restricting positions P1 may be set.

(6) In the above-described embodiment, an example is described in which the vehicle body 5 is arranged below the traveling section 4. However, the present invention is not limited to this configuration, and the vehicle body 5 may be arranged above the traveling section 4, for example.

(7) In the above-described embodiment, an example is described in which the first direction X is the direction along the traveling direction of the traveling section 4. However, the present invention is not limited to this configuration. For example, the first direction X may be a direction orthogonal to the traveling direction of the traveling section 4 in a vertical view. In this case, it is preferable that the second direction Y is a direction along the traveling direction of the traveling section, and the article transport vehicle 1 travels along the second direction Y. As another example, both the first direction X and the second direction Y may be directions that are inclined relative to the traveling direction of the traveling section 4.

Overview of Embodiments

The following is an overview of the article transport vehicle described above.

An article transport vehicle according to an aspect of the present disclosure is an article transport vehicle configured to transport an article, the article transport vehicle including:
 a traveling section including a wheel;
 a vehicle body connected to the traveling section and forming a storage space in which the article is storable;
 a holding section configured to hold the article in a suspended state;
 an elevating section configured to raise and lower the holding section relative to the vehicle body to raise and lower the article held by the holding section between a storage position inside the storage space and a lowered position below the storage space; and
 a fall restricting device configured to restrict falling of a stored article, the stored article being the article at the storage position,
 wherein with a first direction being a specific direction in a horizontal plane, a second direction being a direction orthogonal to the first direction in a vertical view, a first side in the first direction being one side in the first direction, and a second side in the first direction being another side in the first direction,
 the vehicle body includes:
  a first cover section covering the storage space on the first side in the first direction;
  a second cover section covering the storage space on the second side in the first direction; and
  a cover connecting section connecting the first cover section and the second cover section above the storage space,
 the fall restricting device includes:
  a pair of fall restricting members; and
  a driving mechanism configured to drive the pair of fall restricting members,
 the pair of fall restricting members each include:
  a supported section supported by the cover connecting section;
  a pair of vertical extension sections extending downward from the supported section on opposite sides of the stored article in the second direction; and
  a lower connecting section connecting the pair of vertical extension sections below the stored article,
 the driving mechanism is configured to drive the pair of fall restricting members to move between at least one restricting position and a release position,
 while the pairs of vertical extension sections of the pair of fall restricting members are at the at least one restricting position, the pairs of vertical extension sections overlap the stored article in a second direction view along the second direction, and furthermore the lower connecting sections of the pair of fall restricting members overlap the stored article in the vertical view, and
 while the pairs of vertical extension sections of the pair of fall restricting members are at the release position, the lower connecting sections of the pair of fall restricting members are outward of the stored article in the first direction in such a manner as not to overlap the stored article in the vertical view.

According to this configuration, the supported sections of the pair of fall restricting members are supported by the cover connecting section that is above the storage space in the vehicle body. Also, the lower connecting sections below the stored article are suspended by the pairs of vertical extension sections that extend downward from the supported sections. For this reason, while the pair of fall restricting members are at the restricting position, even if the article held by the holding section is released unintentionally, the article can be supported by the lower connecting sections of the pair of fall restricting members. Therefore, it is possible to avoid the case where the article falls from the pair of fall restricting members.

Also, while the article is supported by the lower connecting sections in this way, the load of the article acts as a vertical tensile load on the fall restricting members that extend in the up-down direction from the supported sections to the lower connecting sections. In other words, it is possible to avoid the case where a large bending moment acts on the fall restricting members and the support sections that support the fall restricting members. Therefore, even if the article is heavy, it is easy to secure the strength necessary to support the article without significantly increasing the rigidity of the fall restricting members and the support sections. Also, with this configuration, it is possible to reduce the size and the weight of the fall restricting members and the support sections.

Also, according to the above configuration, while the pair of fall restricting members are at the restricting position, the vertical extension sections overlap the stored article in the second direction view. Therefore, it is possible to prevent the article from entirety or partially falling off in the second direction.

In this way, according to the above configuration, it is possible to realize an article transport vehicle provided with a fall restricting device having a structure that facilitates ensuring strength regardless of the weight of the article.

Here, it is preferable that the vehicle body is shaped so as to be open on at least one side of the storage space in the second direction,
 the driving mechanism moves the supported sections of the pair of fall restricting members in the first direction, and
 while the pairs of vertical extension sections of the pair of fall restricting members are at the release position, the pairs of vertical extension sections of the pair of fall restricting members are outward of the stored article in the first direction in such a manner as not to overlap the stored article in the second direction view.

According to this configuration, while the pair of fall restricting members are at the restricting position, the pairs of vertical extension sections of the pair of fall restricting members can restrict the article from entirely or partially falling off in the second direction, and while the pair of fall restricting members are at the release position, the article can be moved in the second direction from the storage position. Accordingly, it is possible to retrieve the article in the second direction, or transfer the article by sliding it in the second direction, for example.

It is preferable that the driving mechanism includes:
a guide section configured to guide movement in the first direction of the supported sections of the pair of fall restricting members; and
a driving section configured to move the supported sections toward opposite sides in the first direction in each pair of supported sections.

According to this configuration, the pair of fall restricting members can be driven toward opposite sides in the first direction to appropriately move between the restricting position and the release position.

Also, since the pair of fall restricting members are on opposite sides of the stored article in the first direction while at the release position, it is easier to secure escapement space for the pair of fall restricting members at the release position compared with the case where the pair of fall restricting members are both arranged on one side of the stored article in the first direction.

It is preferable that the at least one restricting position includes a plurality of restricting positions set in the first direction.

According to this configuration, a plurality of restricting positions can be set according to sizes of the stored article, and therefore even if there are a plurality of sizes of articles and the article held by the holding section is released unintentionally, the article can be properly supported so as not to fall.

It is preferable that the vehicle body is below the traveling section, and
the cover connecting section is connected to the traveling section.

According to this configuration, the supported sections of the pair of fall prevention members are supported by the cover connecting section, which is the portion connected to the traveling section in the vehicle body. Accordingly, it is easier to ensure the strength of the support sections of the vehicle body that support the pair of fall restricting members.

It is preferable that the first direction is a direction along a traveling direction of the traveling section.

According to this configuration, even if a load acts on the stored article due to acceleration or deceleration of the traveling section, the first cover section and the second cover section can suppress the case where the article entirely or partially falls off in the traveling direction (first direction).

The article transport vehicle according to the present disclosure need only exhibit at least one of the effects described above.

What is claimed is:
1. An article transport vehicle configured to transport an article, the article transport vehicle comprising:
a traveling section comprising a wheel;
a vehicle body connected to the traveling section and forming a storage space in which the article is storable;
a holding section configured to hold the article in a suspended state;
an elevating section configured to raise and lower the holding section relative to the vehicle body to raise and lower the article held by the holding section between a storage position inside the storage space and a lowered position below the storage space; and
a fall restricting device configured to restrict falling of a stored article, wherein the stored article is the article at the storage position,
wherein
a first direction is a specific direction in a horizontal plane, a second direction is a direction orthogonal to the first direction in a vertical view, a first side in the first direction is one side in the first direction, and a second side in the first direction being is another side in the first direction,
the vehicle body comprises:
a first cover section covering the storage space on the first side in the first direction;
a second cover section covering the storage space on the second side in the first direction; and
a cover connecting section connecting the first cover section and the second cover section above the storage space,
the fall restricting device comprises:
a pair of fall restricting members; and
a driving mechanism configured to drive the pair of fall restricting members,
the pair of fall restricting members each comprise:
a supported section supported by the cover connecting section;
a pair of vertical extension sections extending downward from the supported section on opposite sides of the stored article in the second direction; and
a lower connecting section connecting the pair of vertical extension sections below the stored article,
the driving mechanism is configured to drive the pair of fall restricting members to move between at least one restricting position and a release position,
while the pairs of vertical extension sections of the pair of fall restricting members are at the at least one restricting position, the pairs of vertical extension sections overlap the stored article in a second direction view along the second direction, and furthermore the lower connecting sections of the pair of fall restricting members overlap the stored article in the vertical view, and
while the pairs of vertical extension sections of the pair of fall restricting members are at the release position, the lower connecting sections of the pair of fall restricting members are outward of the stored article in the first direction so as not to overlap the stored article in the vertical view.

2. The article transport vehicle according to claim 1, wherein:
the vehicle body is shaped so as to be open on at least one side of the storage space in the second direction,
the driving mechanism moves the supported sections of the pair of fall restricting members in the first direction, and
while the pairs of vertical extension sections of the pair of fall restricting members are at the release position, the pairs of vertical extension sections of the pair of fall restricting members are outward of the stored article in the first direction so as not to overlap the stored article in the second direction view.

3. The article transport vehicle according to claim 2,
wherein the driving mechanism include comprises:
- a guide section configured to guide movement in the first direction of the supported sections of the pair of fall restricting members; and
- a driving section configured to move the supported sections toward opposite sides in the first direction in each pair of supported sections.

4. The article transport vehicle according to claim 1, wherein the at least one restricting position includes a plurality of restricting positions set in the first direction.

5. The article transport vehicle according to claim 1, wherein:
- the vehicle body is below the traveling section, and the cover connecting section is connected to the traveling section.

6. The article transport vehicle according to claim 1, wherein the first direction is a direction along a traveling direction of the traveling section.

* * * * *